(12) United States Patent
Chong et al.

(10) Patent No.: US 10,964,863 B2
(45) Date of Patent: Mar. 30, 2021

(54) METHOD OF PRODUCING AN OPTOELECTRONIC ELEMENT

(71) Applicant: OSRAM Opto Semiconductors GmbH, Regensburg (DE)

(72) Inventors: Chui Wai Chong, Seberang Jaya (MY); Choo Kean Lim, George Town (MY); Seong Tak Koay, George Town (MY); Geok Ling Adelene Ng, George Town (MY); Teng Hai Ocean Chuah, Bukit Mertajam (MY)

(73) Assignee: OSRAM OLED GmbH, Regensburg (DE)

( * ) Notice: Subject to any disclaimer, the term of this patent is extended or adjusted under 35 U.S.C. 154(b) by 12 days.

(21) Appl. No.: 16/471,227

(22) PCT Filed: Jan. 16, 2018

(86) PCT No.: PCT/EP2018/051017
§ 371 (c)(1),
(2) Date: Jun. 19, 2019

(87) PCT Pub. No.: WO2018/134203
PCT Pub. Date: Jul. 26, 2018

(65) Prior Publication Data
US 2020/0119241 A1    Apr. 16, 2020

(30) Foreign Application Priority Data
Jan. 19, 2017 (WO) ................. PCT/EP2017/051108

(51) Int. Cl.
*H01L 33/58* (2010.01)
*H01L 33/48* (2010.01)
(Continued)

(52) U.S. Cl.
CPC ............ *H01L 33/58* (2013.01); *H01L 33/486* (2013.01); *H01L 33/505* (2013.01); *H01L 33/52* (2013.01);
(Continued)

(58) Field of Classification Search
CPC . H01L 33/0004–648; H01L 2933/0058; H01L 2933/0083
See application file for complete search history.

(56) References Cited

U.S. PATENT DOCUMENTS 7,052,821 B2    5/2006   Kohl et al.
10,256,380 B2   4/2019   Moench et al.
(Continued)

FOREIGN PATENT DOCUMENTS

| EP | 1 467 417 A2 | 10/2004 |
|----|--------------|---------|
| JP | 2007-311423 A | 11/2007 |
| WO | 2016/071439 A1 | 5/2016 |

OTHER PUBLICATIONS

Uzunlar, Erdal et al."Low-cost MEMS packaging using polymer-based air-gaps," *ECS Transactions*. 61(3): pp. 237-242. May 2014. https://www.researchgate.net/publication/262767296_Low-cost_MEMS_Packaging_using_Polymer-based_Air-gaps.

*Primary Examiner* — Cuong B Nguyen
(74) *Attorney, Agent, or Firm* — DLA Piper LLP (US)

(57) ABSTRACT

A method of producing an optoelectronic element with a light emitting component, includes arranging a sacrificial layer at least above a part of a light emitting side of the component, forming at least in a part of an outer surface of the sacrificial layer an inverted optic structure, covering the outer surface of the sacrificial layer by a light transparent layer, transferring the inverted optic structure to an inner side of the transparent layer, and removing the sacrificial layer and forming a gap between the component and the
(Continued)

light transparent layer, wherein the light transparent layer includes at the inner side the optic structure.

18 Claims, 4 Drawing Sheets

(51) Int. Cl.
*H01L 33/50* (2010.01)
*H01L 33/52* (2010.01)

(52) U.S. Cl.
CPC ............. *H01L 2933/0058* (2013.01); *H01L 2933/0083* (2013.01)

(56) References Cited

U.S. PATENT DOCUMENTS

| | | |
|---|---|---|
| 2009/0188709 A1 | 7/2009 | Kojima et al. |
| 2010/0237368 A1* | 9/2010 | Kojima .................. H01L 33/62 257/98 |
| 2013/0161671 A1 | 6/2013 | Hsu et al. |
| 2017/0290098 A1* | 10/2017 | Kautzsch ............. H05B 3/0014 |
| 2018/0287022 A1* | 10/2018 | Moench ................ H01L 33/505 |

* cited by examiner

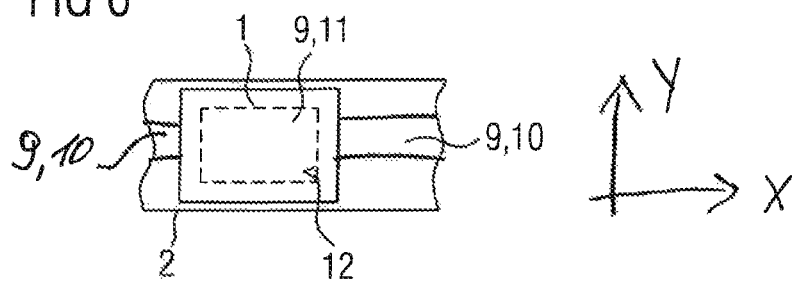
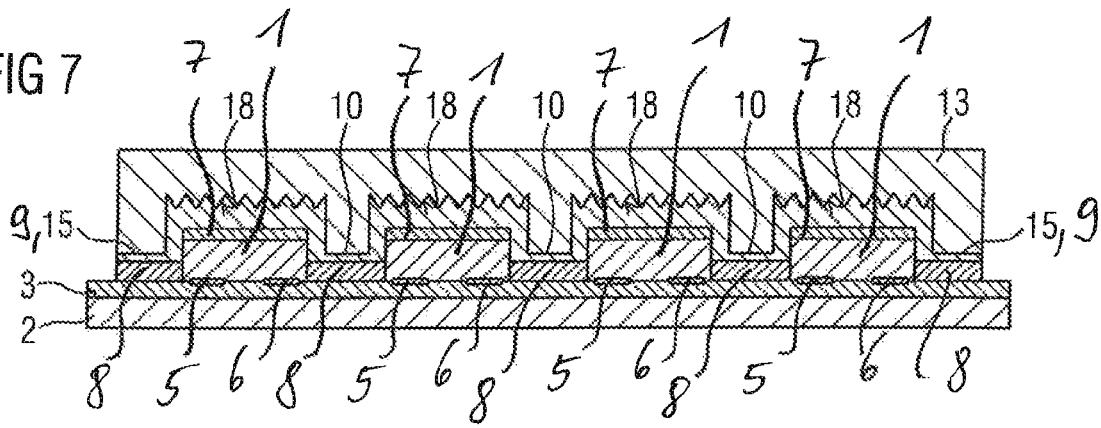
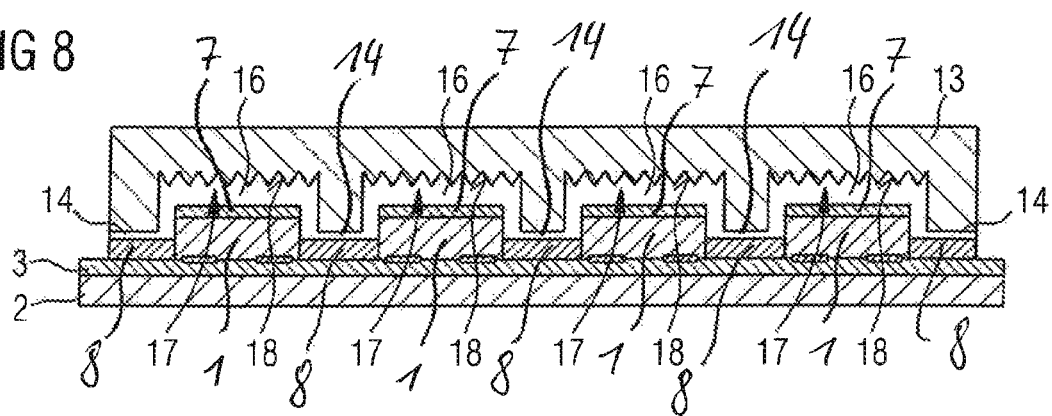
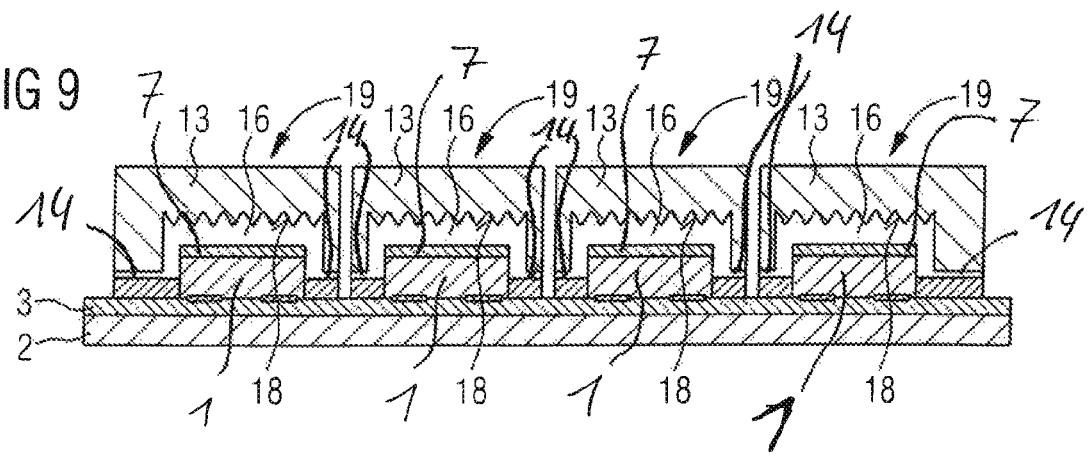

METHOD OF PRODUCING AN OPTOELECTRONIC ELEMENT

TECHNICAL FIELD

This disclosure refers to a method of producing an optoelectronic element with a light emitting component and an optoelectronic element.

BACKGROUND

It is known to produce an optoelectronic element with a light emitting component, wherein the light emitting component is covered by a transparent layer, and the transparent layer comprises at an inner side an optic structure. The optic structure is provided to guide the light emitted by the light emitting component in a predetermined direction.

It is also known to use a sacrificial layer to produce an air gap between a LED and a lens from U.S. Pat. No. 7,052,821 B2 or the article: "Low-cost MEMS packaging using polymer-based air-gaps", E. Uzunlar et al., ECS transactions, 61 "3" page 237-242 (2014), The Electrical Society.

There is nonetheless a need to provide a method of producing an optoelectronic element with a light emitting component.

SUMMARY

We provide a method of producing an optoelectronic element with a light emitting component, including arranging a sacrificial layer at least above a part of a light emitting side of the component, forming at least in a part of an outer surface of the sacrificial layer an inverted optic structure, covering the outer surface of the sacrificial layer by a light transparent layer, transferring the inverted optic structure to an inner side of the transparent layer, and removing the sacrificial layer and forming a gap between the component and the light transparent layer, wherein the light transparent layer includes at the inner side the optic structure.

We also provide an optoelectronic element with a light emitting component, wherein at least above a part of a light emitting side of the component a light transparent layer is arranged, an optic structure is arranged at least at a part of an inner side of the light transparent layer, the inner side is directed to the component, and the element is produced according to a method of producing an optoelectronic element with a light emitting component, including arranging a sacrificial layer at least above a part of a light emitting side of the component, forming at least in a part of an outer surface of the sacrificial layer an inverted optic structure, covering the outer surface of the sacrificial layer by a light transparent layer, transferring the inverted optic structure to an inner side of the transparent layer, and removing the sacrificial layer and forming a gap between the component and the light transparent layer, wherein the light transparent layer includes at the inner side the optic structure.

BRIEF DESCRIPTION OF THE DRAWINGS

FIG. 6 shows a top view on a light emitting component of FIG. 5.

FIG. 7 shows the light emitting components after depositing a light-transparent layer.

FIG. 8 shows the arrangement of FIG. 7 after removal of the sacrificial layer.

FIG. 9 shows a cross-sectional view of the arrangement of FIG. 8 after singulation of light emitting components.

Figure 1:
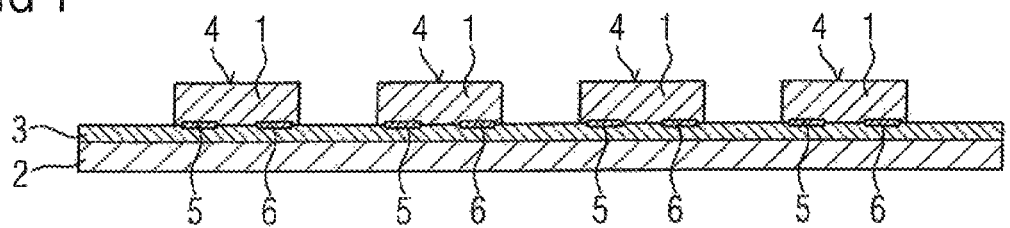
FIG. 1 shows a first process step with light emitting components.

REFERENCE SYMBOLS 1 component
2 carrier
3 release tape
4 top side
5 first electrical contact
6 second electrical contact
7 conversion layer
8 basic layer
9 sacrificial layer
10 flat area
11 block area
12 structured surface
13 second layer
14 tunnel
15 tunnel flat area
16 air gap
17 top inner side
18 optic structure
19 light emitting element
20 first side face component
21 second side face component
22 first inner side face
23 second inner side face
24 third inner side face
25 fourth inner side face
26 third side face component
27 fourth side face component
28 middle axis
29 refraction structure
30 inner area
31 outer area

DETAILED DESCRIPTION

We provide a method of producing an optoelectronic element with a light emitting component, wherein at least above a part of a light emitting side of the component a sacrificial layer is arranged, at least in a part of an outer surface of the sacrificial layer an inverted optic structure is formed, the outer surface of the sacrificial layer is covered by a light transparent layer, the inverted optic structure is transferred to an inner side of the transparent layer, the sacrificial layer is removed and a gap is formed between the component and the light transparent layer, and the light transparent layer comprises at the inner side the optic structure.

It is an advantage of the method of producing a light emitting element that the light transparent layer is precisely arranged with respect to the light emitting component. Furthermore, the optoelectronic element can easily be produced by the method.

The sacrificial layer may comprise polymer and the sacrificial layer may be evaporated after transferring the inverted optic structure to the optic structure of the transparent layer by heating up the sacrificial layer at least to a first temperature forming the gap.

The polymer may be a polycarbonate chosen from polypropylene carbonate, polyethylene carbonate, polycyclohexane carbonate, polycyclohexanepropylene carbonate, polynorbornene carbonate, and combinations thereof. Each of this material can be used to form the sacrificial layer.

The sacrificial layer may comprise plastic crystal, for example, made of trimethylolethane.

The sacrificial layer may be made of polycarbonate or trimethylolethane, wherein the sacrificial layer is evaporated after transferring the inverted optic structure to the optic structure of the transparent layer by heating up the sacrificial layer to at least a first temperature forming the gap. Polycarbonate or trimethylolethane can easily be processed. The inverted optic structure can be precisely formed in the polycarbonate or trimethylolethane, for example, by using photolithographic methods with masks and etching processes. Furthermore, polycarbonate and trimethylolethane can be easily evaporated with moderate temperatures. Depending on the used material for the sacrificial layer temperatures between 100° C. and 200° C. are sufficient for removing the sacrificial layer.

The optic structure may comprise a Fresnel structure or a lens shape. Also, other shapes can be formed as optic structures.

A tunnel may be formed in the light transparent layer, wherein the evaporated material of the sacrificial layer is ventilated out of the gap via the tunnel. This method is fast and allows the forming of large air gaps in short time.

An optoelectronic element with a light emitting component is proposed, wherein at least above a part of a light emitting side of the component a light transparent layer is arranged, an optic structure is arranged at an inner side of the light transparent layer, the inner side is directed to the component, and the element is produced according to the method.

An upper side and side faces of the light emitting component may be covered with the sacrificial layer.

At least one light emitting component may be arranged on a carrier, wherein the sacrificial layer is formed on an upper side of the light emitting component and at least on two opposite side faces of the light emitting component, wherein the sacrificial layer is also formed with tunnel sections beside the opposite side faces of the light emitting component on the carrier with a smaller height, after forming the inverted optic structure in the sacrificial layer and after covering the sacrificial layer by the light transparent layer, the inverted optic structure is transferred to an inner side of the transparent layer, first at least one tunnel section of the sacrificial layer is removed, and then the sacrificial layer is removed and a gap is formed between the light emitting component and the light transparent layer via the at least one tunnel section. The method simplifies removal of the sacrificial layer by using tunnel sections made using the sacrificial layer.

Several light emitting components may be arranged on the carrier, wherein the sacrificial layer is formed on the upper sides of the light emitting components and at least on two opposite side faces of the light emitting components, the sacrificial layer is also formed with tunnel sections beside the opposite side faces of the light emitting components between two light emitting components on the carrier with a smaller height, one common sacrificial layer is formed in one piece for the light emitting components, after forming the inverted optic structure in the sacrificial layer and after covering the sacrificial layer by the light transparent layer, the inverted optic structure is transferred to an inner side of the transparent layer, first at least two tunnel sections of the sacrificial layer that adjoin side faces of the light transparent layer are removed, and then the sacrificial layer is removed and a gap is formed between the light emitting components and the light transparent layer via the two tunnel sections. The method simplifies removal of the common sacrificial layer for several light emitting components by using tunnel sections made using the sacrificial layer.

Each block area of a light emitting component may connect via a flat area of the sacrificial layer with a block section of an adjacent light emitting component in a row and/or in a column direction.

A release tape may cover the carrier and the light emitting component may be arranged on the release tape.

A basic layer may be deposited beside the light emitting component on the carrier before the deposition of the sacrificial layer. The basic layer may adjoin the side faces of the at least one light emitting component.

The tunnel sections may be formed after deposition of the sacrificial layer, for example, by an etching process, stamp molding, compression molding or laser structuring.

The transparent layer may be made of a molding material, for example, a polymer. Molding material can be used to form an optic structure with a simple method.

The transparent layer may be made of silicone. Silicone can easily processed to form an optic structure.

The optic structure may comprise a Fresnel structure. The Fresnel structure provides an advantageous optic structure for guiding the emitted light.

The optic structure may comprise the shape of a lens. Therefore, a precise guiding of the light is attained.

An inner top side of the transparent layer may have an optic structure. This example provides for several applications enough guiding of the light. For example, if the light emitting component is a top emitting component, then the optic structure at the inner top side of the transparent layer is sufficient.

At least one or all inner side faces of the transparent layer may have an optic structure. This is for advantage if the light emitting component is a volume emitting component.

Inner side faces of the light transparent layer may be arranged at a distance from side faces of the light emitting component. Therefore, an air gap is arranged between the inner side faces of the light transparent layer and the side faces of the light emitting component.

Inner side faces of the light transparent layer may be arranged at side faces of the light emitting component. Therefore, no air gap is arranged between the inner side faces of the light transparent layer and the side faces of the light emitting component. As a result, a smaller light emitting unit is attained.

A tunnel may be arranged between the light transparent layer and a basic layer, wherein the tunnel is preferably guided from the air gap to an outer side of the transparent layer. The tunnel may be filled with material or free from material.

The optoelectronic element may be used for light source or a flash light application, for example, as a flash light for a camera or as a flash light for a mobile phone with a camera. Furthermore, the optoelectronic element may be used as a light source for an iris scan application. For example, the light emitting component may emit electromagnetic radiation, for example, infrared electromagnetic radiation. Furthermore, the optoelectronic component may be used as a light source for a projector, especially for a projector.

The above-described properties, features and advantages and the way in which they are achieved will become clearer and more clearly understood in association with the following description of examples explained in greater detail in association with the drawings.

FIG. 1 shows a first process step of producing a light emitting element. A carrier 2 that is, for example, made of stainless steel is provided. The carrier 2 comprises on an upper side a release tape 3. The release tape 3 fixes and releases after heating up the release tape 3 to a predetermined temperature. On the release tape 3, optoelectronic light emitting components 1 are arranged with a lower side. The optoelectronic light emitting components are, for example, sapphire flip-chips. The sapphire flip-chips, for example, emit electromagnetic radiations via a top side 4. The light emitting components may be light emitting diodes or laser diodes. The light emitting components 1 comprise, for example, epitaxial semiconductor layers comprising an active zone with a positive doped semiconductor layer and a negative doped semiconductor layer that form a pn-interface that emit electromagnetic radiation.

The components 1 comprise at a lower side opposite to the top side 4 electrical contacts 5, 6. The electromagnetic radiation may comprise visible light, infrared light and/or ultraviolet light. The component 1 may comprise a semiconductor structure with an active zone that generates the electromagnetic radiation. The semiconductor structure may be arranged on a substrate. The substrate may be a light-transparent material, for example, sapphire.

Figure 2:
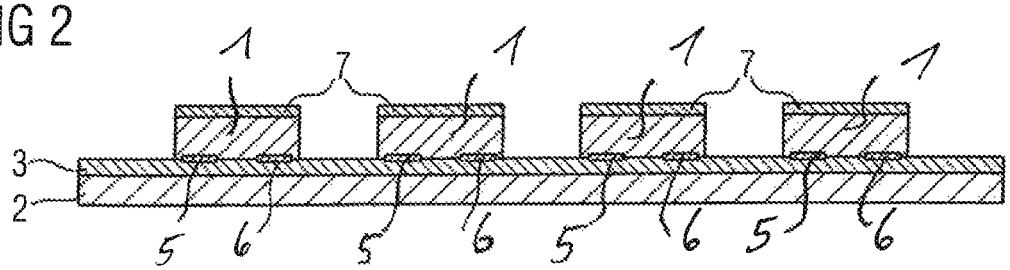
FIG. 2 shows a further process step, wherein a conversion layer is attached on the light emitting components.

FIG. 2 shows a process step after deposition of conversion layers 7 to the top side 4 of the components 1. The conversion layers 7 absorb at least a part of the light of the components 1 and emit a light with a different wavelength. For example, the conversion layers 7 may shift blue light to red light or blue light to green light. Furthermore, the conversion layers 7 may also shift blue light to red and green light. In this, the component 1 with the conversion layer 7 emits white light.

Figure 3:
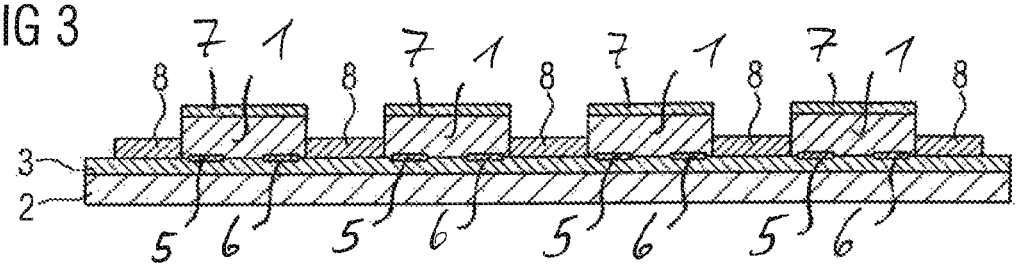
FIG. 3 shows a further process step, wherein a casting layer is deposited.

In a further, a basic layer 8 is deposited on the release tape 3. The basic layer 8 may have a height up to a half height of the components 1 as shown in FIG. 3. The basic layer 8 may comprise reflecting particles as, for example, titanium oxide. The basic layer 8 may have a matrix material comprising silicone or are made of silicone.

Figure 4:
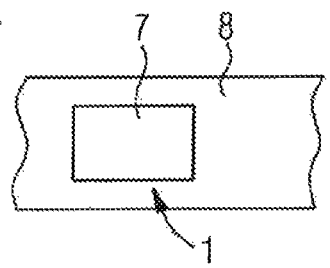
FIG. 4 shows a top view on a light emitting component of FIG. 3.

FIG. 4 shows a part of the arrangement of FIG. 3 in a top view on the conversion layer 7.

Figure 5:
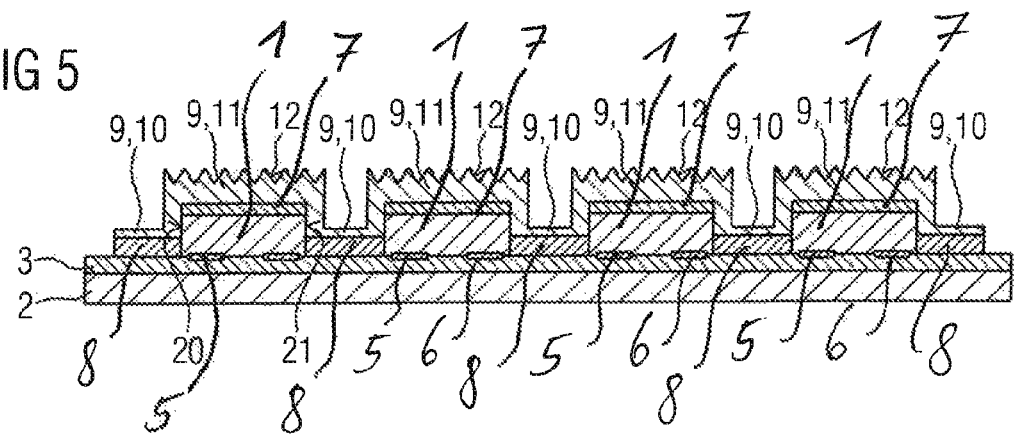
FIG. 5 shows a further process step after depositing and forming a sacrificial layer on the light emitting components.

FIG. 5 shows the arrangement of the components 1 on the carrier 2 after the deposition of a sacrificial layer 9 and after structuring the sacrificial layer 9. The sacrificial layer comprises, for example, polymer or consists of polymer. The polymer may be a polycarbonate chosen from polypropylene carbonate, polyethylene carbonate, polycyclohexane carbonate, polycyclohexanepropylene carbonate, polynorbornene carbonate, and combinations thereof. Furthermore, the sacrificial layer may comprise trimethylolethane or may consist of trimethylolethane.

The sacrificial layer 9 is structured such that at least above a top side 4 of the component 1 the sacrificial layer 9 is arranged. The sacrificial layer 9 is in this example arranged on the conversion layer 7. Also, side faces 20, 21 of the components 1 may be covered by the sacrificial layer 9. The components 1 may be embedded in the sacrificial layer 9 covering the conversion layer 7 and the side faces 20, 21 of the components 1. If there is no conversion layer 7, then the sacrificial layer 9 is arranged directly on the top side 4 of the component 1. There may be further layers between the component 1 and the sacrificial layer 9. Furthermore, there may be further layers between the conversion layer 7 and the sacrificial layer 9. Outer surfaces of the sacrificial layer 9 are formed with structured surfaces 12. Outer surfaces are, for example, side faces or a top face of the sacrificial layer 9 above the upper side of the light emitting component 1. The sacrificial layer 9 may be deposited on the conversions layers 7 of the light emitting components 1, at the side faces 21, 22 of the light emitting components 1 and on the basic layer 8 arranged between the light emitting components 1. If there are no conversion layers 7, then the sacrificial layer 9 is directly deposited on the upper side of the light emitting components 1. If there is no basic layer 8, then the sacrificial layer 9 is deposited between the light emitting components 1 on the release tape 3. If there is no release tape 3, then the sacrificial layer 9 is deposited between the light emitting components 1 on the carrier 2. Between the light emitting components 1, the sacrificial layer 9 has a smaller height in the flat areas 10 along a z-direction. The sacrificial layer 9 may be deposited as a layer with a plane upper surface in a y-x plane covering the components 1 and that fills up the areas between the components 1. Then, the sacrificial layer 9 is structured, for example, with photolithography processes and etching processes to form block areas 11 above the components 1 and flat areas 10 with smaller a height in the z-direction between the block areas 11.

FIG. 6 shows a top view on one component 1 of the arrangement of FIG. 5, wherein the basic layer 8 and the hole component 1 is covered by the sacrificial layer 9. Dotted lines depict the arrangement of the component 1 within the sacrificial layer 9. The sacrificial layer 9 comprises flat areas 10 and block areas 11 that cover the components 1. The block area 11 of the sacrificial layer 9 may have a similar shape as the component 1 since the block area 11 covers the top side 4 of the component 1 and the side faces of the component 1. The flat areas 10 cover preferably only small stripes of the basic layer 8 between two block areas 11 of two components 1. The flat areas 10 may have a width in a y-direction smaller than a width of a block area 11 in the y-direction. However, the width of the flat area in the y-direction may vary and may also be larger than a width of the block area 11. The flat area 10 is guided in the x-direction from a block are 11 to a block area 11 of the next component 1.

Furthermore, the block area 11 comprises at an upper side a structured surface 12. The structured surface 12 is formed by lithography processes and etching processes. The structured surface 12 is an inverted optic structure to guide light in a predetermined way or direction. The structured surface 12 may be an inverted Fresnel structure or an inverted lens structure, for example.

The sacrificial layer 9 may be deposited as a fluid material, for example, as a polymer molding. After deposition of the fluid polymer molding, the arrangement is heated up to a predetermined first temperature. Therefore, the sacrificial layer 9 is prebaked to stabilize the sacrificial layer 9. After prebaking the sacrificial layer 9, pattern masks and photolithography processes are used in combination with etching processes to form a structured surface 12 at least on an upper side of the block area 11 of the sacrificial layer 9. In a further example only side faces of the block area 11 or additional the side faces of the block area 11 may be formed with inverted optic structured surfaces 12. Furthermore, the photolithography processes are used in combination with etching processes to form the block areas 11 and the small flat areas 10 between the block areas 11 as shown in FIGS. 5 and 6.

In a further process step shown in FIG. 7, a second layer 13 made of light transparent material is deposited on the arrangement. The second layer 13 covers the sacrificial layer 9. The inverted optic structure 12 of the sacrificial layer 9 is transferred to an inner side of the second layer 13 forming optic structures 18. The optic structures 18 may have the shape of an optic element, for example, a Fresnel lens or another optic lens.

The second layer 13 may be, for example, made of a molding material. As a molding material silicone can be used. After the deposition of the fluid molding material, the second layer 13 is heated up to a second temperature. The second temperature may be lower than the first temperature. The second temperature reduces the time for solidification the second layer 13.

Each block area 11 may connect to a tunnel 14 guided to an outer side of the second layer 13. The block areas 11 may connect by flat areas 10 of the sacrificial layer 9. Furthermore, a first and a last flat area 15 are guided to opposite side faces of the second layer 13.

In a further process step, the arrangement is heated up to a third temperature. The third temperature is high enough to decompose the sacrificial layer 9. Since the flat areas 15 are guided to a side face of the second layer 13, there are tunnels 14 formed. The tunnels 14 connect the block areas 11 of the sacrificial layer 9 with the environment. Decomposed material of the sacrificial layer 9 can be evaporated and sucked out by a vacuum system connected to the tunnels 14. The third temperature is higher than the first temperature, wherein the first temperature is higher than the second temperature.

As a result, above every component 1 an air gap 16 is generated. Furthermore, the second layer 13 comprises at an inner top side 17 an optic structure 18. The optic structure 18 was formed by the inverted optic structured surface 12 of the sacrificial layer 9. The optic structure 18 may have the shape of a Fresnel structure and/or the shape of a lens structure. The optic structure 18 may have micro optic structures.

In a further process step shown in FIG. 9, light emitting elements 19 with light emitting components 1 and a light-transparent layer 13 are separated using a sawing process or an etching process. After this, the light emitting elements 19 can be released from the release tape 3 using a heating process.

Figure 10:
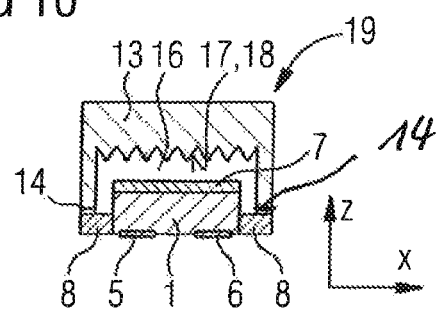
FIG. 10 shows a first cross-sectional view of a singulated light emitting element.

FIG. 10 shows a cross-sectional view through a light emitting element 19 along a z-x-plane. Between side faces of the light emitting component 1 and inner side faces of the transparent layer 13 air gaps are arranged. The inner side faces of the transparent layer 13 are arranged at a distance with respect to side faces of the light emitting component 1. There is an air gap 16 between the four inner side faces of the transparent layer 13 and the four side faces of the light emitting component 1.

Figure 11:
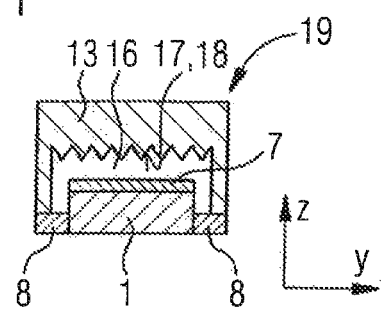
FIG. 11 shows a second cross-sectional view of the light emitting element of FIG. 10.

FIG. 11 shows a second cross-sectional view through the light emitting element 19 of FIG. 10 in a z-y-plane. The light emitting element 19 shown in FIGS. 10 and 11 comprises a component 1 only covered on a top side 4 with a conversion layer 7. Also, side faces 20, 21 of the component 1 may be covered by a conversion layer 7 as shown in FIG. 12.

Figure 12:
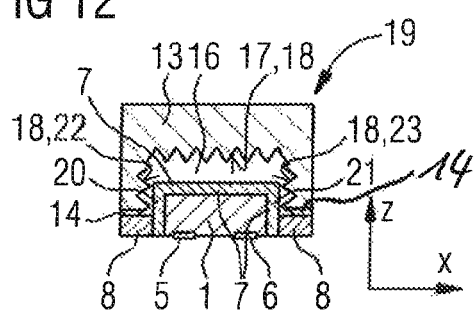
FIG. 12 shows a cross-sectional view of a further optoelectronic light emitting element.
Figure 13:
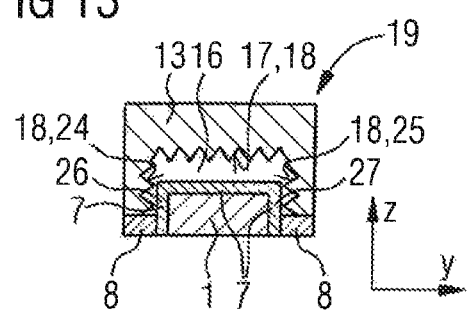
FIG. 13 shows a further cross-sectional view of the light emitting element of FIG. 12.

FIGS. 12 and 13 show cross sectional views of an example of a light emitting element 19 with a light emitting component 1 that may be a volume light emitting component 1, with a silicone lens 13 with micro optic structures 18 at inner top side 17 and with micro optic structures 18 at inner side faces.

FIG. 12 shows a cross-sectional view through the light emitting element 19 in a z-x-plane. The shown light emitting element 19 is processed according to the method explained with respect to FIGS. 1 to 9. The light emitting element 19 has basically the same structure as the example of FIGS. 10 and 11. However, in this example, not only the top side 4 of the component 1, but also the four side faces 20, 21 of the component 1 are covered with a conversion layer 7. This is of advantage if the component 1 is a volume light emitting component 1. The air gap 16 is similar to the air gap 16 of the example of FIGS. 10 and 11. However, in contrast to the example of FIGS. 10 and 11, in the shown example not only an upper inner side 17, but also four inner side faces 22, 23 of the second layer 13 comprise optic structures 18 as explained above. This means that the block areas 11 of the sacrificial layer 9 also had inverted optic structures at the side faces. The second layer 13 is a lens with micro optic structures at the top inner side 17 and the four inner side faces 22, 23. The second layer may be made of silicone.

FIG. 13 shows a further cross-sectional view of the light emitting element 19 of FIG. 12 in a z-y-plane. It can be seen that also the other inner side faces 24, 25 comprise optic structures 18. Only a part of the inner side faces of the second layer 13 may comprise optic structure 18.

Figure 14:
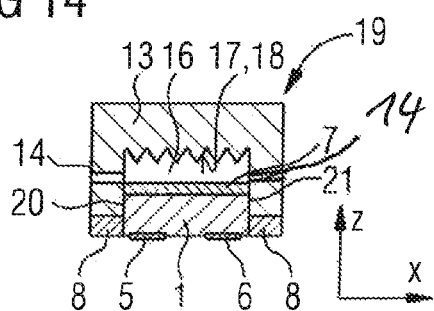
FIG. 14 shows a cross-sectional view of a further light emitting element.
Figure 15:
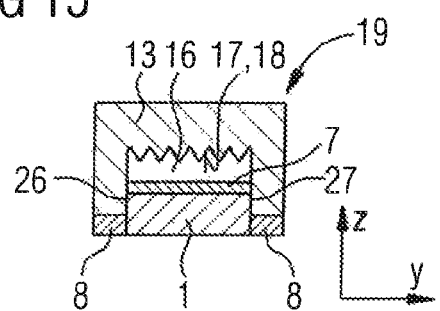
FIG. 15 shows a further cross-sectional view of the light emitting element of FIG. 14.

FIGS. 14 and 15 show cross sectional views of an example of a light emitting element 19 with a light emitting component 1 that may be a top light emitting component 1, with a silicone lens 13 with micro optic structure 18 at inner top side 17.

FIG. 14 shows a cross-sectional view in a z-x-plane of a further light emitting element 19. The shown light emitting element 19 is processed according to the method explained with respect to FIGS. 1 to 9. The light emitting element 19 is similar to the example of FIGS. 10 and 11. However, in contrast to the example of FIGS. 10 and 11, the air gap 16 is only arranged above the top side 4 of the component 1 which means above the conversion layer 7. The four side faces 20, 21 of the component 1 are in contact with the second layer 13. In the shown example, only an upper inner side 17 of the second layer 13 comprise optic structures 18 as explained above. The second layer 13 is a lens with micro optic structures at the top inner side 17. The second layer 13 may be made of silicone. The light emitting component 1 may be a top light emitting component 1.

FIG. 15 shows a cross-sectional view in a z-y-plane of the light emitting element 19 of FIG. 14. It can be seen that also the other side faces 26, 27 of the light emitting components 1 are covered by the second layer 13. Also, the example of FIGS. 14 and 15 may comprise a second layer 13 with inner side faces that comprise optic structures 18 as shown in the example of FIGS. 12 and 13.

The block area 11 may be a rectangular shape. The block area 11 may also be a spherical shape, for example, a half-spherical shape with an optic structure 18. Since the sacrificial layer and the sacrificial material can be formed in different shapes also the inner side of the second layer 13 can have different shapes depending on the used example.

The method and the light emitting element provide a method and a light emitting element that can be used to create an air gap of direct molded lens with micro-optic structures directly on a light emitting component. Therefore, smaller light emitting elements can be produced via a direct molded air cavity with optic structures 18 above the light emitting component 1. The optic structure 18 can be precisely formed with respect to the component 1 since the sacrificial layer 9 is directly molded on the component 1 and the lithography processes and etching processes have the advantage to precisely form the block area 11 with the structured surface 12 with respect to the light emitting component 1. Also, other technics may be used for patterning the sacrificial layer 9 with the inverse optic structure 12, for example, stamp molding, compression molding or laser structuring.

Figure 16:
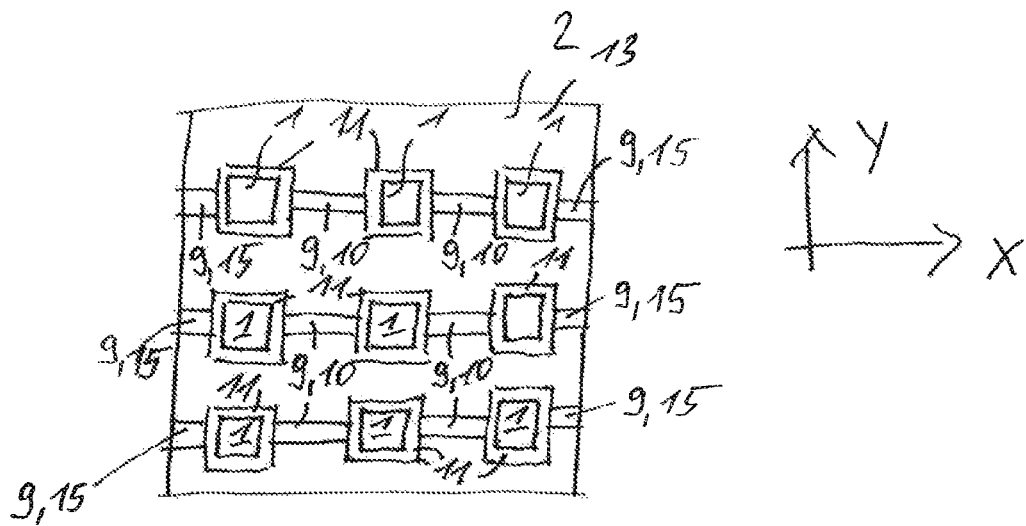
FIG. 16 shows a cross sectional view of a further example with an arrangement as shown in FIG. 7.

FIG. 16 shows a cross sectional view in a y-x-plane of a further example with an arrangement as shown in FIG. 7, wherein, in this example, there are three rows of light emitting components 1 arranged on the carrier 2. The light emitting components 1 may have conversion layers as shown in FIG. 7. The light emitting components 1 are covered with a sacrificial layer 9. The sacrificial layer 9 and the carrier 2 are covered by the second layer 13. The sacrificial layer 9 has block areas 11 that cover the light emitting components 1. The block areas 11 of one row connect by flat areas 10 of the sacrificial layer 9. The first and the last flat area of a row constitute a tunnel flat area 15 guided to side faces of the second layer 13. The sacrificial layer 9 can be removed by using the opposite tunnel flat areas 15 of a row to form tunnels 14 as shown in FIG. 8.

Figure 17:
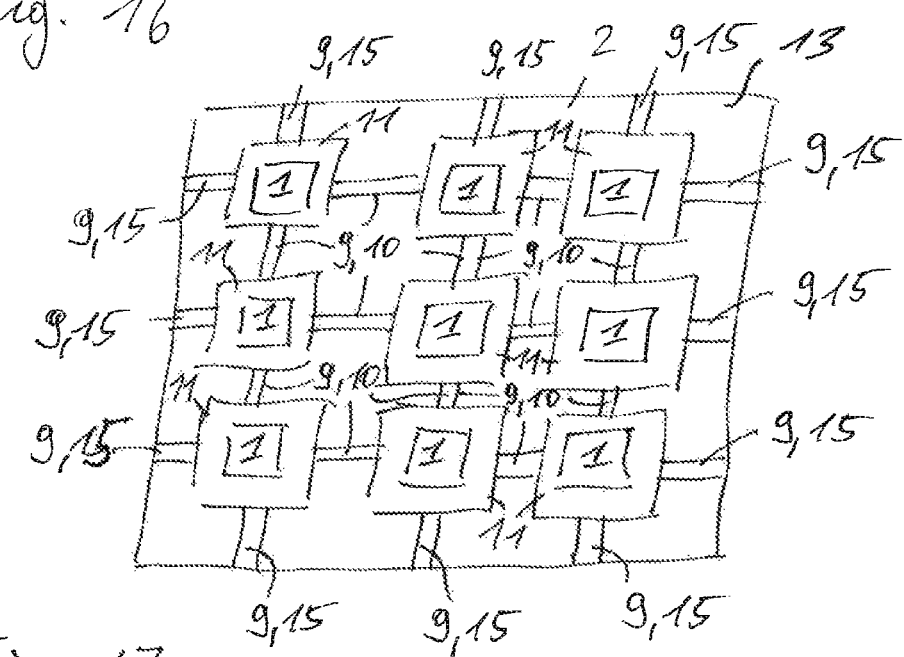
FIG. 17 shows a cross sectional view of a further example with an arrangement as shown in FIG. 7.

FIG. 17 shows a cross sectional view in a y-x-plane of a further example with an arrangement as shown in FIG. 16, wherein, in this example, there are three rows of light emitting components 1 arranged on the carrier 2. Furthermore, there are three columns of light emitting components 1. The light emitting components 1 may have conversion layers as shown in FIG. 7. The light emitting components 1 are covered with a sacrificial layer 9. The sacrificial layer 9 and the carrier 2 are covered by the second layer 13. The sacrificial layer 9 has block areas 11 that cover the light emitting components 1. The block areas 11 of one row connect by flat areas 10 of the sacrificial layer 9. The first and the last flat area of a row constitute a tunnel flat area 15 guided to side faces of the second layer 13. The block areas 11 of one column connect by flat areas 10 of the sacrificial layer 9. The first and the last flat area of a column constitute a tunnel flat area 15 guided to side faces of the second layer 13. The sacrificial layer 9 can be removed by using the tunnel flat areas 15 of the rows and the tunnel flat areas 15 of the columns to form tunnels 14 as shown in FIG. 8.

The arrangements of FIGS. 16 and 17 can also have less or more than two light emitting units in a row and can have less or more than three rows or can have more or less than three columns of light emitting components.

Figure 18:
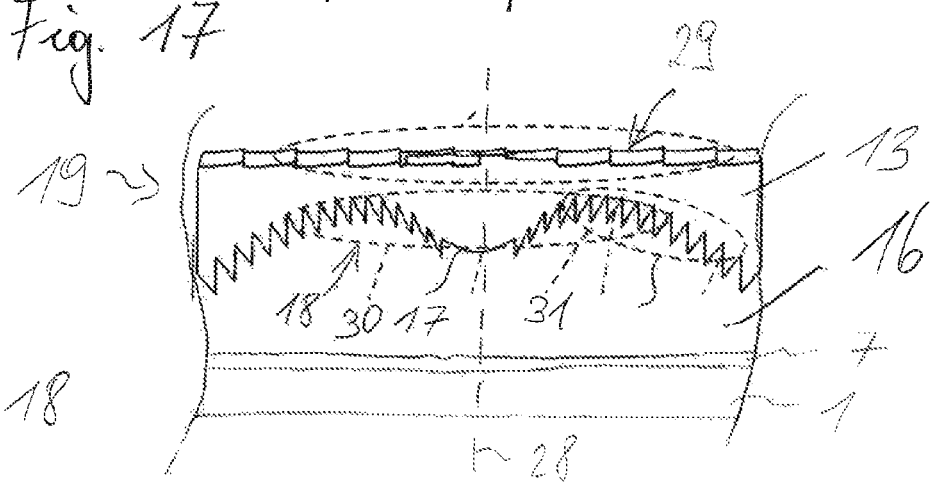
FIG. 18 shows a schematic cross sectional view of a further example of a light emitting element.

FIG. 18 shows a schematic cross section of a further example of a light emitting element 19 with a light emitting component 1 with a conversion layer 7 on top of the component 1. A second layer 13 with a top inner side 17 is arranged above the component 1. The top inner side 17 comprises an optic structure 18 produced according to the above discussed methods. The optic structure 18 has a lens shape, especially a Fresnel structure. The Fresnel structure is axially symmetric to a middle axis 28. The Fresnel structure focuses the light of the component 1 to generate the favoured light beam, for example, a flash light beam. The optic structure 18 may have an inner area 30 marked with a dotted line with optical collecting structure and an outer area 31 marked with a dotted line with an optical reflecting structure. The optical reflecting structure 31 may comprise as a structure vertical cylinders. At an upper side face of the second layer there may be arranged a refraction structure 29 to improve the favoured light beam.

The method reduces process steps and it is not necessary to provide a lens mounter. Furthermore, a better brightness and color uniformity is attained because of better placement accuracy between a center of the component versus a center of the micro-optic structure. The light emitting element can, for example, be used as a light emitting element, for example, as lights especially as flash lights for cameras, projectors, iris scan apparatus mobile phones or mobile devices.

Furthermore, the gap 16 of any discussed light emitting element may be free of material or may be filled with gas or material. If the gap 16 is filled with gas, then the tunnel 14 have to be closed with material, for example, with silicone or polymer.

Our elements and methods have been illustrated and described in detail with the aid of the preferred examples. Nevertheless, this disclosure is not restricted to the examples disclosed. Rather, other variants may be derived therefrom by those skilled in the art without departing from the protective scope of the appended claims.

This application claims priority of PCT/EP2017/051108 the subject matter of which is incorporated herein by reference.

The invention claimed is:

1. A method of producing an optoelectronic element with a light emitting component, comprising:
    arranging a sacrificial layer at least above a part of a light emitting side of the light emitting component,
    forming at least in a part of an outer surface of the sacrificial layer an inverted optic structure,
    covering the inverted optic structure of the outer surface of the sacrificial layer by a light transparent layer,
    transferring the inverted optic structure to an inner side of the light transparent layer, and
    removing the sacrificial layer and forming a gap between the light emitting component and the light transparent layer such that the inner side of the light transparent layer comprises an optic structure,
    wherein the sacrificial layer comprises a polycarbonate that is at least one selected from the group consisting of polypropylene carbonate, polyethylene carbonate, polycyclohexane carbonate, polycyclohexanepropylene carbonate and polynorbornene carbonate, and the sacrificial layer is evaporated after transferring the inverted optic structure to the optic structure of the light transparent layer by heating up the sacrificial layer to at least a first temperature forming the gap.

2. The method of claim 1, wherein the inverted optic structure is etched in the sacrificial layer using a mask.

3. The method of claim 1, wherein the optic structure comprises a Fresnel structure.

4. The method of claim 1, wherein the optic structure comprises a lens shape.

5. The method of claim 1, wherein a top surface and/or a side surface of the sacrificial layer is formed with the inverted optic structure.

6. The method of claim 1, wherein an upper side and side faces of the light emitting component are covered with the sacrificial layer.

7. The method of claim 1, wherein a tunnel is formed in the light transparent layer, and the evaporated material of the sacrificial layer is ventilated out of the gap via the tunnel.

8. The method of claim 1, wherein at least one light emitting component is arranged on a carrier, the sacrificial layer is formed on an upper side of the light emitting component and at least on two opposite side faces of the light emitting component, the sacrificial layer is also formed with at least one tunnel section beside the side face of the light emitting component on the carrier with a smaller height, after forming the inverted optic structure in the sacrificial layer and after covering the sacrificial layer by the light transparent layer, the inverted optic structure is transferred to an inner side of the light transparent layer, the at least one tunnel section of the sacrificial layer is removed, and then the sacrificial layer is removed via the at least one tunnel section and the gap is formed between the light emitting component and the light transparent layer.

9. The method of claim 8, wherein several light emitting components are arranged on the carrier, the sacrificial layer is formed on the upper sides of the light emitting components and at least on two opposite side faces of the light emitting components, the sacrificial layer is also formed with tunnel sections beside the opposite side faces of the light emitting components between two light emitting components on the carrier with a smaller height, one common sacrificial layer is formed in one piece for the light emitting components, after forming the inverted optic structure in the sacrificial layer and after covering the sacrificial layer by the light transparent layer, the inverted optic structure is transferred to an inner side of the light transparent layer, first at least two tunnel sections of the sacrificial layer that adjoin side faces of the light transparent layer are removed, and then the sacrificial layer is removed and the gap is formed between the light emitting components and the light transparent layer via the two tunnel sections.

10. The method of claim 8, wherein the tunnel sections are formed after deposition of the sacrificial layer by an etching process, stamp molding, compression molding or laser structuring.

11. The method of claim 1, wherein a light emitting side of the component is covered by a conversion layer before the sacrificial layer is deposited.

12. The optoelectronic element with the light emitting component, wherein at least above the part of the light emitting side of the light emitting component the light transparent layer is arranged, the optic structure is arranged at least at the part of the inner side of the light transparent layer, the inner side is directed to the light emitting component, a tunnel is arranged between the light transparent layer and a basic layer, the tunnel is guided from the gap to an outer side of the transparent layer, and the optoelectronic element is produced according to the method of claim 1.

13. The optoelectronic element of claim 12, wherein the light transparent layer comprises molding material, polymer or silicone.

14. The optoelectronic element of claim 12, wherein the optic structure comprises a Fresnel structure.

15. The optoelectronic element of claim 12, wherein at least an inner top side of the light transparent layer and/or inner side faces of the light transparent layer have an optic structure.

16. The optoelectronic element of claim 12, wherein inner side faces of the light transparent layer are arranged at a distance from side faces of the light emitting component, or inner side faces of the light transparent layer are arranged at side faces of the light emitting component.

17. A method of producing an optoelectronic element with a light emitting component, comprising:
arranging a sacrificial layer at least above a part of a light emitting side of the light emitting component,
forming at least in a part of an outer surface of the sacrificial layer an inverted optic structure,
covering the inverted optic structure of the outer surface of the sacrificial layer by a light transparent layer,
transferring the inverted optic structure to an inner side of the light transparent layer, and
removing the sacrificial layer and forming a gap between the component and the light transparent layer such that the inner side of the light transparent layer comprises an optic structure,
wherein the sacrificial layer comprises trimethylolethane.

18. A method of producing an optoelectronic element with a light emitting component, comprising:
arranging a sacrificial layer at least above a part of a light emitting side of the light emitting component,
forming at least in a part of an outer surface of the sacrificial layer an inverted optic structure,
covering the inverted optic structure of the outer surface of the sacrificial layer by a light transparent layer,
transferring the inverted optic structure to an inner side of the light transparent layer, and
removing the sacrificial layer and forming a gap between the light emitting component and the light transparent layer such that the inner side of the light transparent layer comprises an optic structure,
wherein at least one light emitting component is arranged on a carrier, the sacrificial layer is formed on an upper side of the light emitting component and at least on two opposite side faces of the light emitting component, the sacrificial layer is also formed with at least one tunnel section beside the side face of the light emitting component on the carrier with a smaller height, after forming the inverted optic structure in the sacrificial layer and after covering the sacrificial layer by the light transparent layer, the inverted optic structure is transferred to an inner side of the light transparent layer, the at least one tunnel section of the sacrificial layer is removed, and then the sacrificial layer is removed via the at least one tunnel section and the gap is formed between the light emitting component and the light transparent layer.

* * * * *